United States Patent
Park et al.

(10) Patent No.: US 9,953,965 B2
(45) Date of Patent: Apr. 24, 2018

(54) SEMICONDUCTOR PACKAGE

(71) Applicant: SK hynix Inc., Icheon-si Gyeonggi-do (KR)

(72) Inventors: Gi Guk Park, Icheon-si (KR); Hyung Ho Cho, Seoul (KR); Tae Lim Song, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 51 days.

(21) Appl. No.: 15/206,626

(22) Filed: Jul. 11, 2016

(65) Prior Publication Data
US 2017/0278833 A1    Sep. 28, 2017

(30) Foreign Application Priority Data
Mar. 22, 2016   (KR) ........................ 10-2016-0033893

(51) Int. Cl.
*H01L 29/40*   (2006.01)
*H01L 25/18*   (2006.01)
(Continued)

(52) U.S. Cl.
CPC .............. *H01L 25/18* (2013.01); *G11C 5/025* (2013.01); *G11C 5/04* (2013.01); *G11C 5/063* (2013.01);
(Continued)

(58) Field of Classification Search
CPC ...... G11C 14/0018; H01L 2224/48106; H01L 2224/48145; H01L 2224/48227; H01L 2224/73265; H01L 2225/06506; H01L 2225/0651; H01L 2225/06541; H01L 2225/06562; H01L 2225/06572; H01L 24/17; H01L 24/32; H01L 24/48; H01L 24/73; H01L 25/0652; H01L 25/18; H01L 2924/1436; H01L 2924/1438; H01L 2924/1443; H01L 2224/16227;
(Continued)

(56) References Cited

U.S. PATENT DOCUMENTS

2011/0133324 A1   6/2011  Fan
2012/0241956 A1*  9/2012  Bolken ............... H01L 23/3128
                                                    257/738

(Continued)

FOREIGN PATENT DOCUMENTS

KR     1020140064053 A     5/2014

*Primary Examiner* — Long K Tran
(74) *Attorney, Agent, or Firm* — William Park & Associates Ltd.

(57) ABSTRACT

A semiconductor package may include a DRAM chip mounted on a substrate; an interposer stacked over the DRAM chip and including redistribution structures; a nonvolatile memory chip stacked over the interposer; a memory controller chip mounted on the substrate, and including a control circuit for controlling the nonvolatile memory chip and first pads and second pads electrically coupled to the control circuit; first conductive coupling members configured to electrically couple bonding pads of the nonvolatile memory chip to the redistribution structures; second conductive coupling members configured to electrically couple the redistribution structures to the first pads; and third conductive coupling members configured to electrically couple the second pads to the substrate.

19 Claims, 10 Drawing Sheets

(51) Int. Cl.
- H01L 23/48 (2006.01)
- H01L 25/065 (2006.01)
- G11C 5/02 (2006.01)
- G11C 5/04 (2006.01)
- G11C 5/06 (2006.01)
- G11C 11/00 (2006.01)
- H01L 23/00 (2006.01)
- G11C 14/00 (2006.01)
- H01L 23/31 (2006.01)

(52) U.S. Cl.
CPC ............ *G11C 5/066* (2013.01); *G11C 11/005* (2013.01); *H01L 23/481* (2013.01); *H01L 24/73* (2013.01); *H01L 25/0652* (2013.01); *G11C 14/0018* (2013.01); *H01L 23/3128* (2013.01); *H01L 24/05* (2013.01); *H01L 24/06* (2013.01); *H01L 24/13* (2013.01); *H01L 24/14* (2013.01); *H01L 24/16* (2013.01); *H01L 24/32* (2013.01); *H01L 24/48* (2013.01); *H01L 24/49* (2013.01); *H01L 24/92* (2013.01); *H01L 2224/0401* (2013.01); *H01L 2224/04042* (2013.01); *H01L 2224/0557* (2013.01); *H01L 2224/06181* (2013.01); *H01L 2224/131* (2013.01); *H01L 2224/1403* (2013.01); *H01L 2224/14181* (2013.01); *H01L 2224/16145* (2013.01); *H01L 2224/16227* (2013.01); *H01L 2224/32145* (2013.01); *H01L 2224/32225* (2013.01); *H01L 2224/4824* (2013.01); *H01L 2224/48091* (2013.01); *H01L 2224/48106* (2013.01); *H01L 2224/48145* (2013.01); *H01L 2224/48147* (2013.01); *H01L 2224/48227* (2013.01); *H01L 2224/49175* (2013.01); *H01L 2224/73204* (2013.01); *H01L 2224/73215* (2013.01); *H01L 2224/73253* (2013.01); *H01L 2224/73257* (2013.01); *H01L 2224/73265* (2013.01); *H01L 2224/92125* (2013.01); *H01L 2225/0651* (2013.01); *H01L 2225/06506* (2013.01); *H01L 2225/06541* (2013.01); *H01L 2225/06562* (2013.01); *H01L 2225/06565* (2013.01); *H01L 2225/06572* (2013.01); *H01L 2924/1436* (2013.01); *H01L 2924/1438* (2013.01); *H01L 2924/1443* (2013.01); *H01L 2924/15192* (2013.01); *H01L 2924/15311* (2013.01); *H01L 2924/15788* (2013.01); *H01L 2924/19107* (2013.01)

(58) Field of Classification Search
CPC . H01L 2224/32145; H01L 2224/32225; H01L 2224/48091
USPC .................................................. 257/737, 777
See application file for complete search history.

(56) References Cited

U.S. PATENT DOCUMENTS

| | | | |
|---|---|---|---|
| 2015/0187745 A1* | 7/2015 | Chiu | H01L 25/18 257/738 |
| 2015/0214206 A1* | 7/2015 | Kumar | H01L 24/24 257/777 |
| 2015/0318261 A1* | 11/2015 | Chung | H01L 21/76898 257/774 |

* cited by examiner

US 9,953,965 B2

SEMICONDUCTOR PACKAGE

CROSS-REFERENCES TO RELATED APPLICATION

The present application claims priority under 35 U.S.C. § 119(a) to Korean Patent Application No. 10-2016-0033893 filed in the Korean intellectual property office on Mar. 22, 2016, which is incorporated herein by reference in its entirety.

BACKGROUND

1. Technical Field

Various embodiments generally relate to a semiconductor technology, and more particularly, to a semiconductor package including different kinds of memory chips.

2. Related Art

Recently, research has been conducted on a variety of methods for implementing a semiconductor package which is capable of performing a high-speed operation while having different kinds of memory chips mounted thereon.

SUMMARY

In an embodiment, a semiconductor package may include: a DRAM chip mounted on a substrate; an interposer stacked over the DRAM chip and including redistribution structures; a nonvolatile memory chip stacked over the interposer; a memory controller chip mounted on the substrate, and including a control circuit for controlling the nonvolatile memory chip and first pads and second pads electrically coupled to the control circuit; first conductive coupling members configured to electrically couple bonding pads of the nonvolatile memory chip to the redistribution structures; second conductive coupling members configured to electrically couple the redistribution structures to the first pads; and third conductive coupling members configured to electrically couple the second pads to the substrate. The memory controller chip may be arranged closer to the substrate than the nonvolatile memory chip, and the nonvolatile memory chip may be electrically coupled to the substrate through the first conductive coupling members, the redistribution structures, the second conductive coupling members, the memory controller chip, and the third conductive coupling members.

DETAILED DESCRIPTION

Hereinafter, a semiconductor package will be described below with reference to the accompanying drawings through various examples of embodiments.

Figure 1:
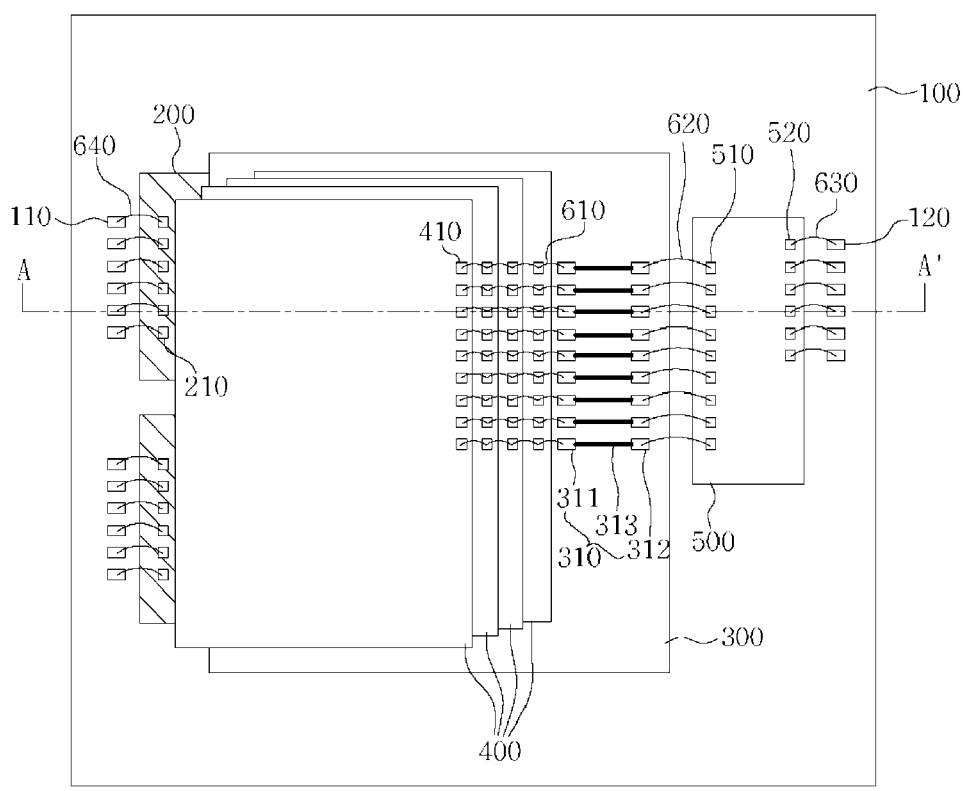
FIG. 1 is a plan view of a semiconductor package in accordance with an embodiment.
Figure 2:
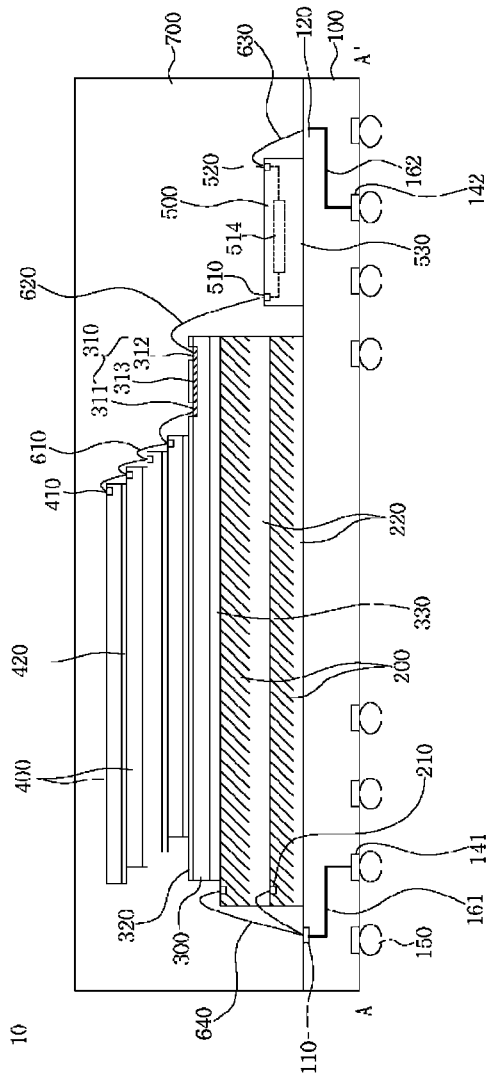
FIG. 2 is a cross-sectional view taken along line A-A' of FIG. 1.

Referring to FIGS. 1 and 2, a semiconductor package 10 in accordance with an embodiment may include a substrate 100, DRAM (Dynamic Random Access Memory) chips 200, an interposer 300, nonvolatile memory chips 400, and a memory controller chip 500. The semiconductor package 10 in accordance with the present embodiment may further include first to fourth conductive coupling members 610 to 640 and an encapsulant 700. In order to promote understanding, the illustration of the encapsulant 700 is omitted in FIG. 1.

Each of the DRAM chips 200 may be mounted on the substrate 100 and may include a first circuit (not illustrated) and first bonding pads 210. The first circuit may include a memory cell array and a peripheral circuit.

The memory cell array included in the first circuit may have a structure in which a plurality of DRAM cells each including one transistor and one capacitor are arranged in a matrix shape along the row and column directions. The peripheral circuit included in the first circuit may include a row decoder for selecting a row of the memory cell array, a column decoder for selecting a column of the memory cell array, and a control circuit for controlling the operations of the column decoder and the row decoder.

The first bonding pads 210 may serve as external contacts for electrical coupling between the outside and the first circuit. The first bonding pads 210 may be arranged on an active surface of the corresponding DRAM chip 200, and electrically coupled to the first circuit. The first bonding pads 210 may be arranged along one edge of the active surface of the DRAM chip 200. That is, the DRAM chips 200 may include edge-pad type chips.

On an inactive surface of the DRAM chip 200, facing the active surface, a first adhesive member 220 made of a tape or resin-type adhesive may be formed. The DRAM chips 200 may be stacked over a top surface of the substrate 100 adhered to the substrate 100 by the first adhesive member 220.

In the present embodiment, the DRAM chips 200 may be vertically stacked such that the side surfaces thereof are aligned with each other. In the present embodiment, it has been described that the DRAM chips 200 are vertically stacked. However, the DRAM chips 200 may be stacked in a zigzag shape such that one edge thereof, at which the first bonding pads 210 are positioned, are exposed on the left and right sides, or the DRAM chips 200 may be offset in stages such that the edges at which the first bonding pads 210 are positioned are exposed in a stepwise manner.

FIGS. 1 and 2 illustrate that the plurality of DRAM chips 200 are stacked. The present embodiment is not limited thereto, but may include all cases in which one or more DRAM chips 200 are stacked.

The DRAM chips 200 may be electrically coupled to the substrate 100, and electrically coupled to an external host through the substrate 100. The electrical coupling structure between the DRAM chips 200 and the substrate 100 will be apparent through the following descriptions.

The interposer 300 may include redistribution structures 310. The redistribution structures 310 may be arranged on the top surface of the interposer 300. Each of the redistribution structures 310 may include a first redistribution pad 311, a second redistribution pad 312, and a redistribution line 313 for coupling the first and second redistribution pads 311 and 312. The interposer 300 may have first dielectric layer 320 formed on the top surface thereof, the first dielectric layer 320 may cover the redistribution lines 313 while leaving the first and second redistribution pads 311 and 312 exposed. The interposer 300 may have a second adhesive member 330 formed on a bottom surface thereof, the second adhesive member 330 being made of a tape or resin-type adhesive. The interposer 300 may be attached to a top surface of the uppermost DRAM chip 200 through the second adhesive member 330.

The nonvolatile memory chips 400 may be stacked over the interposer 300. Each of the nonvolatile memory chips 400 may include a second circuit (not illustrated) and second bonding pads 410. The second circuit may include a memory cell array and a peripheral circuit.

The nonvolatile memory chip 400 may include a NAND flash chip, and the memory cell array included in the second circuit may include a plurality of cell strings. A cell string refers to a unit of nonvolatile memory cells coupled in series, and the nonvolatile memory cells included in one cell string may be selected by the same select transistor.

The peripheral circuit included in the second circuit may include a row decoder for selecting a word line of the memory cell array and a page buffer for selecting a bit line. The page buffer may operate as a write driver or sense amplifier according to an operation mode. During a program operation, the page buffer may transmit a voltage to a bit line of the memory cell array, the voltage corresponding to data to be programmed. During a read operation, the page buffer may sense data stored in a selected memory cell through a bit line. During an erase operation, the page buffer may float a bit line of the memory cell array.

The second bonding pads 410 may serve as external contacts for electrical coupling between the second circuit and the outside. The second bonding pads 410 may be arranged on an active surface of the corresponding nonvolatile memory chip 400, and electrically coupled to the second circuit. The second bonding pads 410 may be arranged along one edge of the active surface of the nonvolatile memory chip 400. That is, the nonvolatile memory chips 400 may include edge pad-type chips.

On an inactive surface of the nonvolatile memory chip 400, facing the active surface, a third adhesive member 420 made of a tape or resin-type adhesive may be formed. The nonvolatile memory chips 400 may be stacked over the interposer 300 and adhered to each other by the third adhesive members 420 such that one edge thereof, at which the second bonding pads 410 are positioned, is arranged close to the redistribution structures 310 of the interposer 300. The nonvolatile memory chips 400 may be offset in stages such that edges at which the second bonding pads 410 are positioned are exposed in a stepwise manner.

In the present embodiment, it has been described that the plurality of nonvolatile memory chips 400 are stacked. However, the present embodiment is not limited thereto, but may include all cases and manners in which one or more nonvolatile memory chips 400 may be stacked.

The memory controller chip 500 may include a control circuit 514 implemented as an integrated circuit in which individual elements such as transistors, resistors, capacitors, and fuses are electrically coupled to each other, the individual elements being required to control the nonvolatile memory chips 400.

The memory controller chip 500 may be mounted on and electrically coupled to the substrate 100, and electrically coupled to an external host through the substrate 100. The memory controller chip 500 may receive a control signal from the host through the substrate 100, and control the nonvolatile memory chips 400 in response to the control signal from the host. That is, the memory controller chip 500 may control the nonvolatile memory chips 400 to store data therein, to read data stored therein, or to erase data, in response to a write/read/erase request from the host. The electrical coupling structure between the memory controller chip 500 and the substrate 100 will be apparent through the following descriptions.

The memory controller chip 500 may include third bonding pads 510 and 520 formed on an active surface thereof. The third bonding pads 510 and 520 may include first pads 510 and second pads 520. The first pads 510 may serve as an external contact for electrical coupling between the control circuit 514 and the nonvolatile memory chips 400, and the second pads 520 may serve as external contacts for electrical coupling between the control circuit 514 and the substrate 100.

On an inactive surface of the memory controller chip 500, facing the active surface, a fourth adhesive member 530 made of a tape or resin-type adhesive may be formed. The memory controller chip 500 may be attached to the top surface of the substrate 100 through the fourth adhesive member 530. Thus, the memory controller chip 500 may be arranged closer to the substrate 100 than the nonvolatile memory chips 400, and the distance between the substrate 100 and the third bonding pads 510 and 520 of the memory controller chip 500 may be shorter than any of the distances between the substrate 100 and the second bonding pads 410 of the nonvolatile memory chips 400.

The memory controller chip 500 may be arranged in such a manner that one edge of the memory controller chip 500, at which the first pads 510 are positioned, faces the edges of the nonvolatile memory chips 400, at which the second bonding pads 410 are positioned.

The redistribution structures 310 of the interposer 300 may be arranged between the edges of the nonvolatile memory chips 400, at which the second bonding pads 410 are positioned, and the edge of the memory controller chip 500, at which the first pads 510 are positioned. The first redistribution pads 311 of the redistribution structures 310 may be arranged relatively closer to the second bonding pads 410 of the nonvolatile memory chips 400 than the second redistribution pads 312, and the second redistribution pads 312 of the redistribution structures 310 may be arranged relatively closer to the first pads 511 of the memory controller chip 500 than the first redistribution pads 311.

The substrate 100 may be selected from a ceramic substrate, a glass substrate, a printed circuit board and an interposer substrate. Alternatively, the substrate 100 may be formed of an active wafer.

The substrate 100 may include first and second bonding fingers 110 and 120 formed on the top surface thereof on which the DRAM chips 200 and the memory controller chip 500 may be mounted. The first bonding fingers 110 may be electrically coupled to the DRAM chips 200 via the fourth conductive coupling members 640, and the second bonding fingers 120 may be electrically coupled to the memory controller chip 500 via the second conductive coupling member 620.

The substrate 100 may include a plurality of external electrodes 141 and 142 formed on a bottom surface thereof. The external electrodes 141 and 142 may include first external electrodes 141 and second external electrodes 142. The substrate 100 may further include first internal lines 161 for electrically coupling the first bonding fingers 110 to the first external electrodes 141, and second internal lines 162 for electrically coupling the second bonding fingers 120 to the second external electrodes 142.

The first and second external electrodes 141 and 142 may have external coupling terminals 150 formed thereon. The external coupling terminals 150 may include solder balls, conductive bumps, conductive posts, or a combination thereof. FIGS. 1 and 2 illustrate the case in which solder balls are used as the external coupling terminals 150.

The semiconductor package 10 may be mounted on an external device, for example, an external system board or a main board through the external coupling terminals 150, electrically coupled to a host through the system board or main board, and operated according to a request of the host.

The second bonding pads 410 of the nonvolatile memory chips 400 may be electrically coupled to the first redistribution pads 311 of the redistribution structure 310 of the interposer 300 through first conductive coupling members 610. The first conductive coupling members 610 may include conductive wires. As illustrated in FIGS. 1 and 2, each of the first conductive coupling members 610 may electrically couple each of the second bonding pads 410 of the nonvolatile memory chips 400. In addition, each of the first conductive coupling members 610 may electrically couple the second bonding pad 410 of the lowermost nonvolatile memory chip 400 to the first redistribution pad 311 of the redistribution structure 310.

The second redistribution pads 312 of the redistribution structure 310 may be electrically coupled to the first pads 510 of the memory controller chip 500 through the second conductive coupling members 620. The second conductive coupling members 620 may include conductive wires.

The second pads 520 of the memory controller chip 500 may be electrically coupled to the second bonding fingers 120 of the substrate 100 through third conductive coupling members 630. The third conductive coupling members 630 may include conductive wires.

The first bonding pads 210 of the DRAM chips 200 may be electrically coupled to the first bonding fingers 110 of the substrate 100 through fourth conductive coupling members 640. The fourth conductive coupling members 640 may include conductive wires. The fourth conductive coupling members 640 may provide first electrical paths which serve to transmit signals between the DRAM chips 200 and the substrate 100. The first adhesive member 220 for attaching the DRAM chips 200 to each other may be formed of a material into which a wire can be penetrated and/or which can be hardened. For example, the first adhesive member 220 may be formed of a thermosetting adhesive member such as PST (Penetrate Spacer Tape). A part of the fourth conductive coupling members 640 may penetrate or pass through the first adhesive member 220.

The encapsulant 700 may be formed on the top surface of the substrate 100 so as to cover the DRAM chips 200, the interposer 300, the nonvolatile memory chips 400, the memory controller chip 500, and the first to fourth conductive coupling members 610 to 640. The encapsulant 700 may include one or more materials selected from polymer composite materials such as epoxy resin with a filler, epoxy acrylate with a filler, and polymer with a filler.

The nonvolatile memory chips 400 may be electrically coupled to the substrate 100 through the first conductive coupling members 610, the redistribution structures 310, the second conductive coupling members 620, the memory controller chip 500, and the third conductive coupling members 630. The first conductive coupling members 610, the redistribution structures 310, the second conductive coupling members 620, the memory controller chip 500, and the third conductive coupling members 630 may provide second electrical paths which serve to transmit signals, for example, data signals between the nonvolatile memory chips 400 and the substrate 100.

The electrical paths (second electrical paths) between the nonvolatile memory chips 400 and the substrate 100 may have a greater length than the electrical paths (first electrical paths) between the DRAM chips 200 and the substrate 100. Thus, an operating speed of the semiconductor package 10 may be determined by the lengths of the second electrical paths, and the lengths of the second electrical paths need to be shortened in order to improve the operating speed of the semiconductor package 10.

As described above, the nonvolatile memory chips 400 may be electrically coupled to the substrate 100 through the memory controller chip 500. Thus, when the length of the electrical path between the memory controller chip 500 and the substrate 100 is reduced, the lengths of the second electrical paths can be reduced.

In the present embodiment, since the memory controller chip 500 is not arranged over the nonvolatile memory chips 400 but arranged over the substrate 100, the length of the electrical path between the memory controller chip 500 and the substrate 100 can be reduced more than when the memory controller chip 500 is arranged over the nonvolatile memory chips 400. Thus, since the lengths of the second electrical paths are shortened, the operating speed of the semiconductor package 10 can be improved.

The first external electrodes 141 of the substrate 100 may be electrically coupled to the DRAM chips 200 through the first internal lines 161, the first bonding fingers 110, and the fourth conductive coupling members 640. That is, the first external electrodes 141 of the substrate 100 may serve as external electrodes of the semiconductor package 10, which electrically couple an external device and the DRAM chips 200.

The second external electrodes 142 of the substrate 100 may be electrically coupled to the memory controller chip 500 through the second internal lines 162, the second bonding fingers 120, and the third conductive coupling members 630. That is, the second external electrodes 142 of the substrate 100 may serve as external electrodes of the semiconductor package 10, which electrically couple an external device and the memory controller chip 500.

Figure 3:
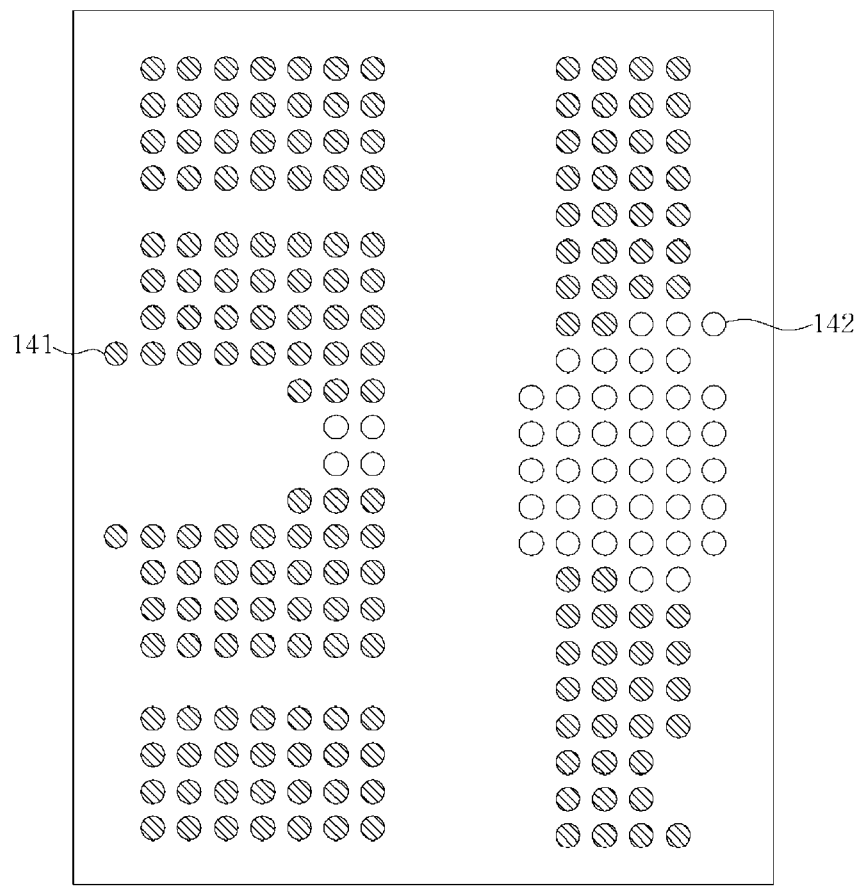
FIG. 3 is a plan view of first and second external electrodes formed on a bottom surface of a substrate.

FIG. 3 is a plan view of the bottom surface of the substrate 100, illustrating that the plurality of first and second external electrodes 141 and 142 are arranged across the entire bottom surface of the substrate 100.

As such, since a large number of first and second external electrodes 141 and 142 are arranged across the entire bottom surface of the substrate 100, the first internal lines 161 for electrically coupling the first external electrodes 141 to the first bonding fingers 110 and the second internal lines 162 for electrically coupling the second external electrodes 142 to the second bonding fingers 120 may also be arranged across the entire region of the substrate 100. Thus, since a design margin is reduced by the space occupied by the first and second internal lines 161 and 162, it is not easy to form the internal lines in the substrate 100, the internal lines serving to couple the nonvolatile memory chips 400 and the memory controller chip 500. When the internal lines for coupling the memory chips 400 and the memory controller chip 500 are formed in the substrate 100, the number of internal lines formed in the substrate 100 may be excessively increased to degrade a degree of freedom in designing the internal lines. Thus, since the lengths of the internal lines are increased, the signal integrity may be degraded, and the operating speed may be reduced.

In the present embodiment, the nonvolatile memory chips 400 may be electrically coupled to the memory controller chip 500 through the first conductive coupling members 610, the redistribution structures 310, and the second conductive coupling members 620. That is, the nonvolatile memory chips 400 may be electrically coupled to the memory controller chip 500 without the substrate 100 therebetween. Thus, the substrate 100 may exclude internal lines for electrically coupling the nonvolatile memory chips 400 and the memory controller chip 500. Thus, the number of internal lines formed in the substrate 100 can be significantly reduced, compared to when internal lines for coupling the nonvolatile memory chips 400 and the memory controller chip 500 are formed in the substrate 100.

Thus, the degree of freedom in designing other internal lines formed in the substrate 100, for example, the first and second internal lines 161 and 162 can be improved. The design of the first internal line 161 can be optimized to improve the signal transmission ability between the DRAM chips 200 and the external host, and the second internal line 162 can be optimized to improve the signal transmission ability between the memory controller chip 500 and the external host.

Since the second electrical paths do not pass through the substrate 100, the design of the second electrical paths can be optimized to shorten the lengths of the second electrical paths, without a design constraint caused by the first and second internal lines 161 and 162 formed in the substrate 100. In the present embodiment, the memory controller chip 500 may be arranged in such a manner that an edge of the memory controller chip 500 at which the first pads 510 are positioned, faces the edges of the nonvolatile memory chips 400 at which the second bonding pads 410 are positioned, and the redistribution structures 310 may be arranged between the edges of the nonvolatile memory chips 400 at which the second bonding pads 410 are positioned, and the edge of the memory controller chip 500 at which the first pads 510 are positioned. Thus, the lengths of the first conductive coupling members 610, the redistribution structures 310, and the second conductive coupling members 620 can be minimized. As a result, since the lengths of the second electrical paths are shortened, an operating speed of the semiconductor package 10 can be improved while the signal integrity is improved.

The present embodiment is not limited to the structure described with reference to FIGS. 1 and 2, but can be modified in various manners. The modifiable embodiments will be described below with reference to FIGS. 4 to 9.

Figure 4:
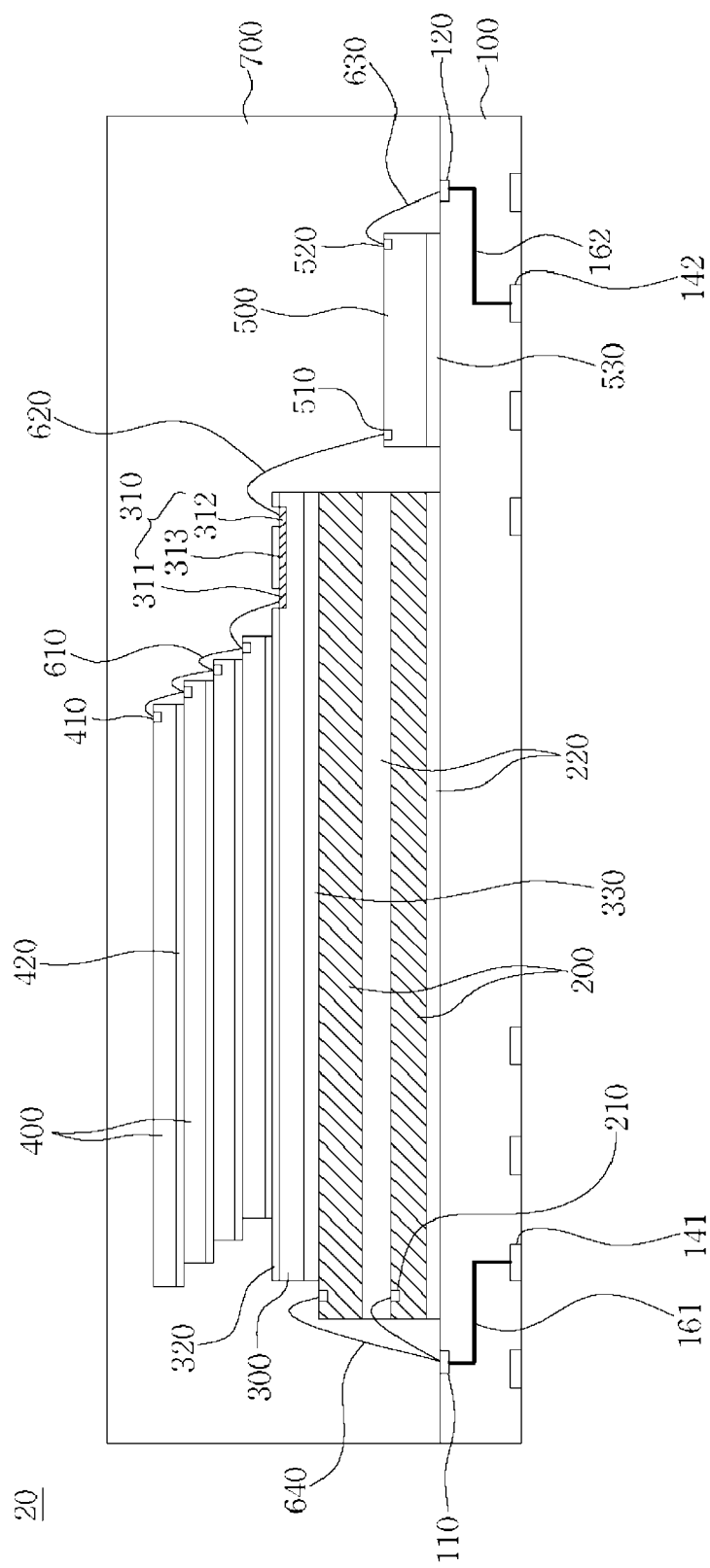
FIG. 4 is a cross-sectional view of a semiconductor package in accordance with an embodiment.
Figure 5:
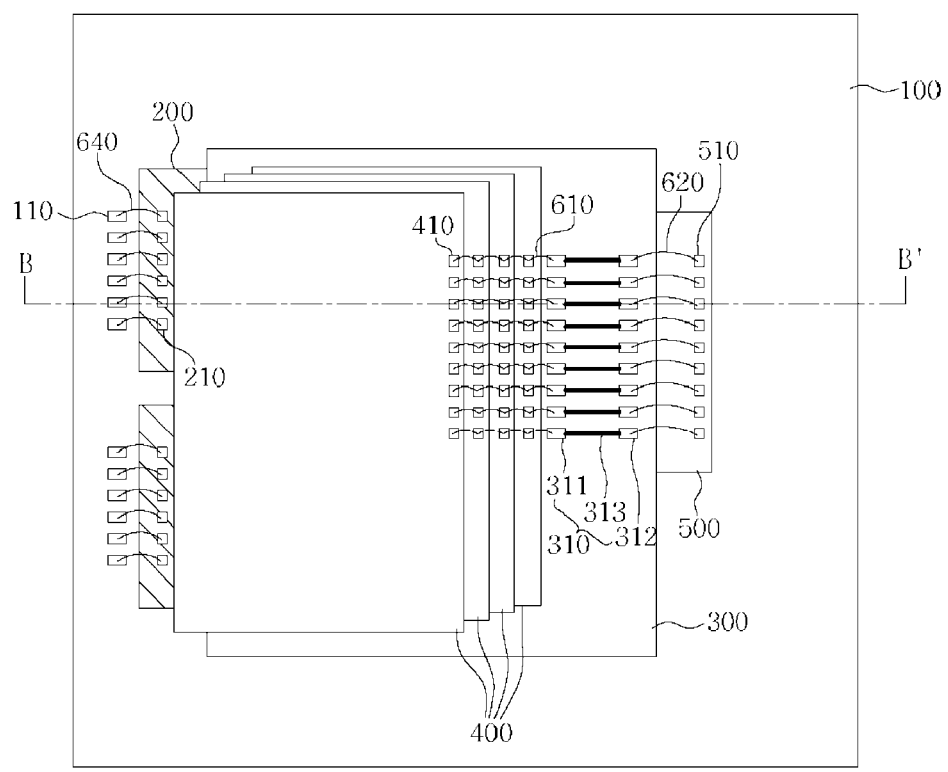
FIG. 5 is a plan view of a semiconductor package in accordance with an embodiment.
Figure 6:
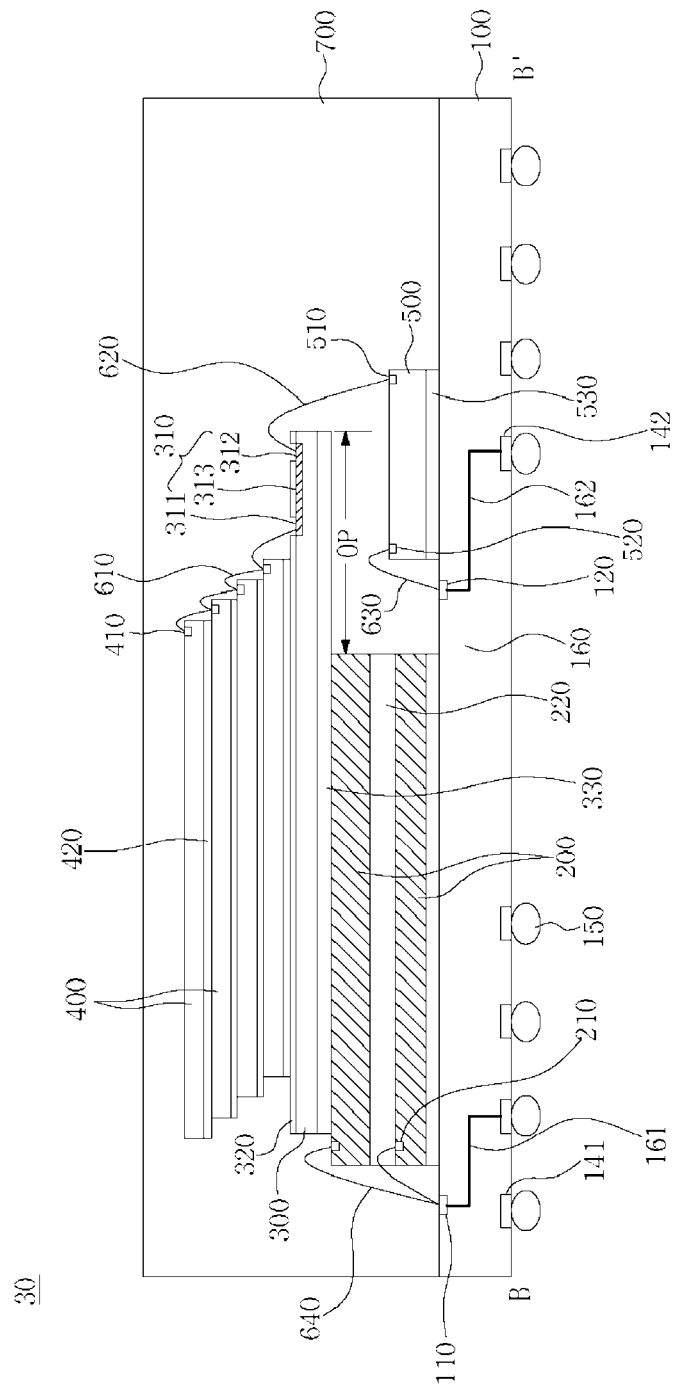
FIG. 6 is a cross-sectional view taken along line B-B' of FIG. 5.
Figure 7:
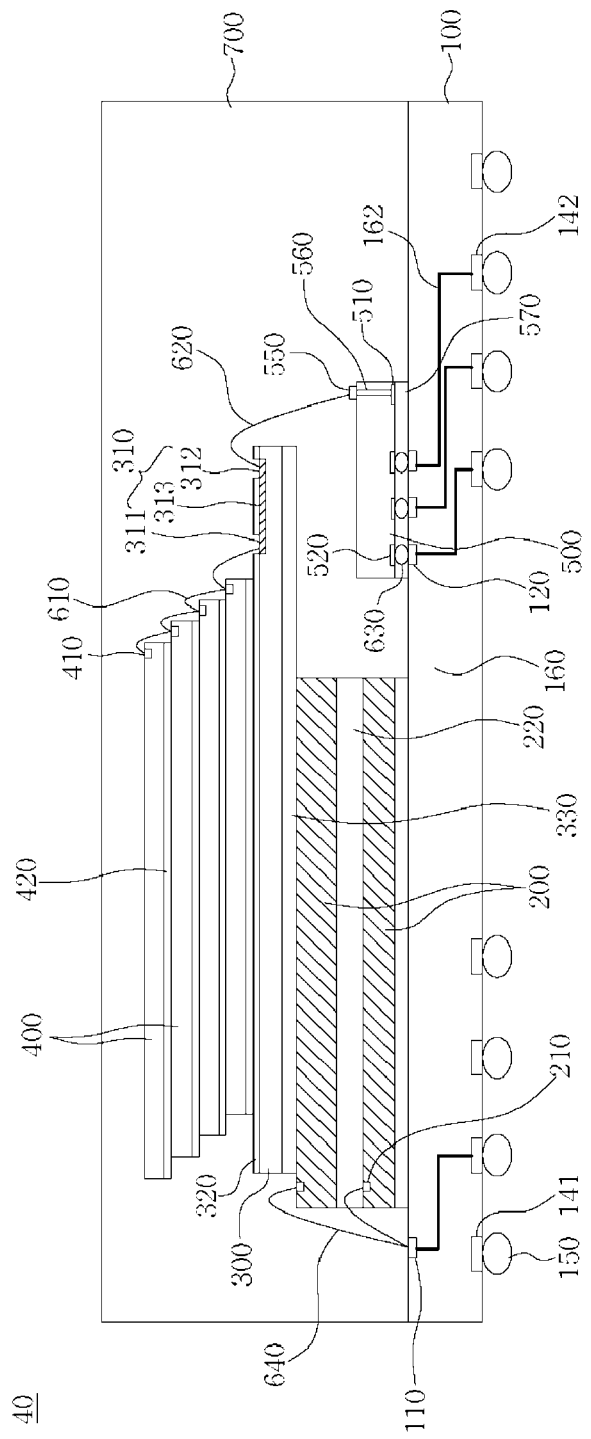
FIG. 7 is a cross-sectional view of a semiconductor package in accordance with an embodiment.
Figure 8:
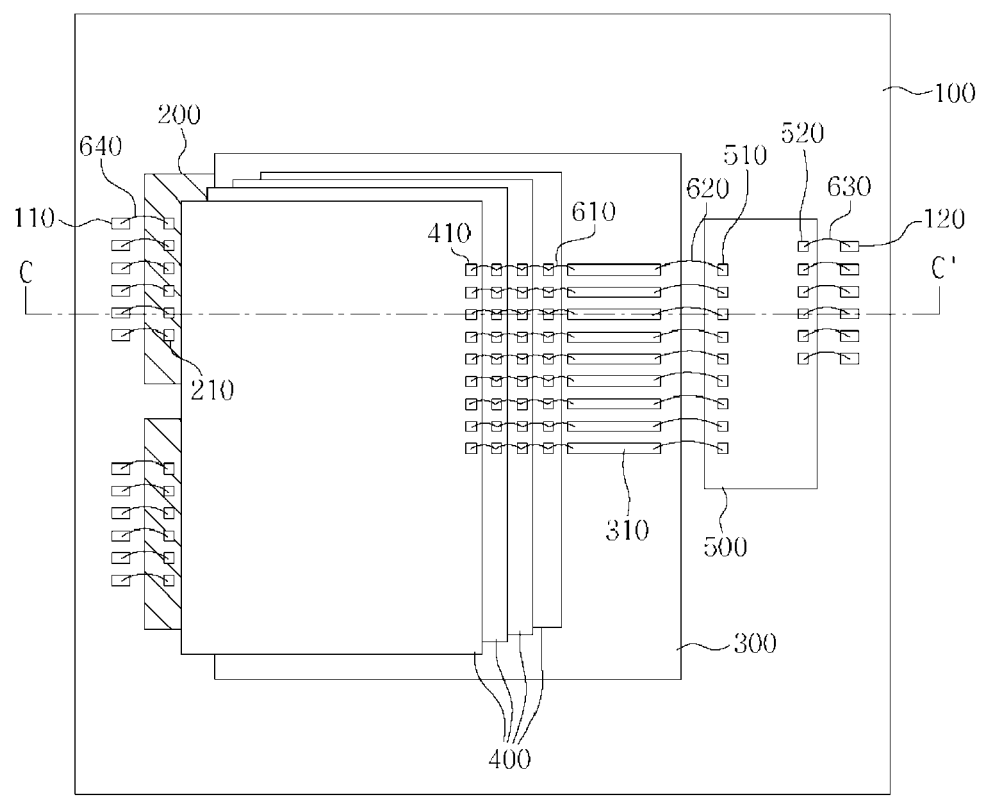
FIG. 8 is a plan view of a semiconductor package in accordance with an embodiment.
Figure 9:
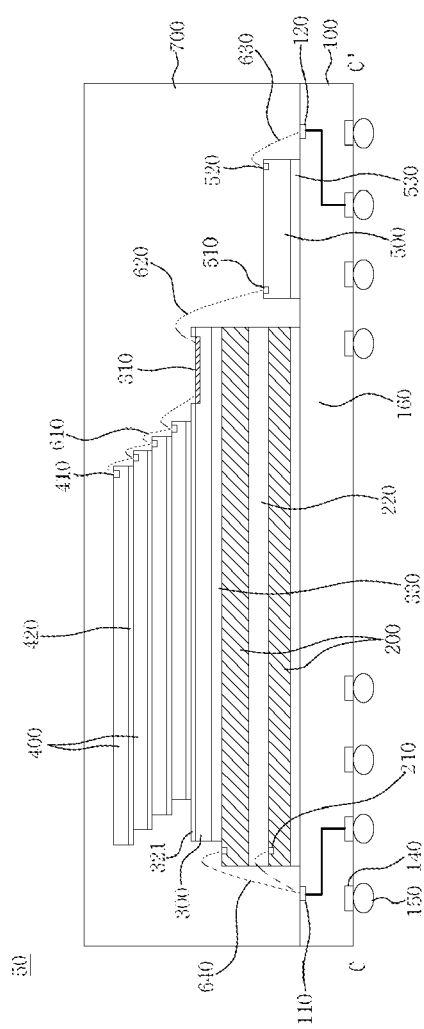
FIG. 9 is a cross-sectional view taken along line C-C' of FIG. 8.

FIG. 4 is a cross-sectional view of a semiconductor package 20 in accordance with an embodiment, FIG. 5 is a plan view of a semiconductor package 30 in accordance with an embodiment, FIG. 6 is a cross-sectional view taken along line B-B' of FIG. 5, and FIG. 7 is a cross-sectional view of a semiconductor package 40 in accordance with an embodiment. FIG. 8 is a plan view of a semiconductor package 50 in accordance with an embodiment, and FIG. 9 is a cross-sectional view taken along line C-C' of FIG. 8.

In the embodiments described with reference to FIGS. 4 to 9, substantially the same components as those described with reference to FIGS. 1 and 2 will be represented by like names and reference numbers, therefore the duplicated descriptions of the same components will be omitted.

Referring to FIG. 4, the substrate 100, the DRAM chips 200, the interposer 300, the nonvolatile memory chips 400, the memory controller chip 500, and the encapsulant 700 may be provided in the form of a card-type package or main board-mounted package. For example, the semiconductor package 20 may have a structure in which the external coupling terminals 150 of FIG. 2 are omitted.

Referring to FIGS. 5 and 6, the interposer 300 may have an overhang portion OP protruding beyond side surfaces of the DRAM chips 200. Specifically, the DRAM chips 200 may have a smaller width than the interposer 300, and one end portion of the interposer 300 may protrude beyond the side surfaces of the DRAM chips 200, thereby forming the overhang portion OP.

The memory controller chip 500 may be arranged in such a manner that the nonvolatile memory chips 400 are above but not over the memory controller chip 500. Further the memory controller chip 500 may be arranged such that a part of the memory controller chip 500 is covered by the overhang portion OP of the interposer 300. For example, the memory controller chip 500 may be arranged in such a manner that a part thereof, excluding an edge at which the first pads 510 are positioned, overlaps the overhang portion OP of the interposer 300. The second pads 520 of the memory controller chip 500 may be arranged under the overhang portion OP of the interposer 300, and the third conductive coupling members 630 for electrically coupling the second pads 520 of the memory controller chip 500 to the second bonding fingers 120 of the substrate 100 may also be arranged under the overhang portion OP of the interposer 300. The memory controller chip 500 may also be coupled to the redistribution structures 310 via the second conductive coupling members 620. Further, the redistribution structures 310 may be formed over the memory controller chip 500, but the redistribution structures 310 may only be in contact with the memory controller chip 500 via the second conductive coupling members 620.

In accordance with the present embodiment, since a part of the memory controller chip 500 is covered by the overhang portion OP of the interposer 300, a size of the semiconductor package 30 can be significantly reduced. Furthermore, the third conductive coupling members 630 may be arranged under the overhang portion OP of the interposer 300, which makes it possible to suppress an increase of the package size, caused by the third conductive coupling members 630.

Referring to FIG. 7, the third conductive coupling members 630 may be implemented as bumps. The third conductive coupling members 630 may be formed on the active surface of the memory controller chip 500, on which the first pads 510 and the second pads 520 are positioned, so as to be electrically coupled to the second pads 520.

The memory controller chip 500 may be mounted on the second bonding fingers 120 of the substrate 100 through the third conductive coupling members 630 according to a flip-chip bonding method. On the inactive surface of the memory controller chip 500, facing the active surface, an additional pad 550 may be formed. The memory controller chip 500 may include a through-chip vias 560 for electrically coupling the first pads 510 and the additional pads 550 through the memory controller chip 500 from the inactive surface. Between the memory controller chip 500 and the substrate 100, an under-fill member 570 may be formed.

Referring to FIGS. 8 and 9, the redistribution structures 310 of the interposer 300 may be implemented as line-type pads. One end of the line-type pads forming the redistribution structures 310 may be coupled to the first conductive coupling members 610, and the other ends of the line-type pads, facing the one ends thereof, may be coupled to the second conductive members 620. The interposer 300 may have second dielectric layer 321 formed on a top surface thereof, the second dielectric layer 321 leaving the redistribution structures 310 comprising the line-type pads exposed.

The above-described semiconductor packages may be applied to various semiconductor devices and package modules.

Figure 10:
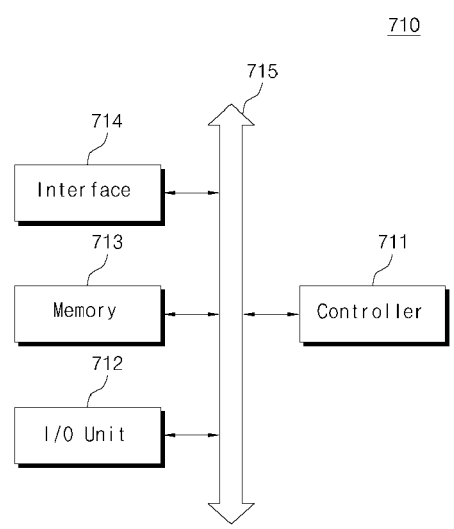
FIG. 10 is a block diagram of an electronic system including a semiconductor package in accordance with an embodiment.

Referring to FIG. 10, the semiconductor packages in accordance with the present embodiments may be applied to an electronic system 710. The electronic system 710 may include a controller 711, an input/output 712, and a memory 713. The controller 711, the input/output 712, and the memory 713 may be coupled to each other through a bus 718 to provide a path through which data are transmitted.

For example, the controller 711 may include one or more microprocessors, one or more digital signal processors, one or more microcontrollers, and one or more of logic circuits capable of performing the same functions as the components. The memory 713 may include one or more of the semiconductor packages in accordance with the present embodiments. The input/output 712 may include one or more selected from a keypad, a keyboard, a display device, and a touch screen. The memory 713 may store data and/or a command executed by the controller 711 or the like.

The memory 713 may include a volatile memory device such as DRAM and/or a nonvolatile memory device such as a flash memory. For example, the flash memory may be mounted in an information processing system such as a mobile terminal or desktop computer. The flash memory may be implemented as an SSD (Solid State Disk). In this case, the electronic system 710 may stably store a large amount of data in the flash memory system.

The electronic system 710 may further include an interface 714 configured to transmit/receive data to/from a communication network. The interface 714 may include a wired or wireless interface. For example, the interface 714 may include an antenna, a wired transceiver, or a wireless transceiver.

The electronic system 710 may be a mobile system, a personal computer, an industrial computer, or a logic system which performs various functions. For example, the mobile system may correspond to any one of a PDA (Personal Digital Assistant), a portable computer, a tablet computer, a mobile phone, a smart phone, a wireless telephone, a laptop computer, a memory card, a digital music system, and an information transmitting/receiving system.

When the electronic system 710 performs wireless communications, the electronic system 710 may be used in a communication system such as CDMA (Code Division Multiple Access), GSM (Global System for Mobile communication), NADC (North American Digital Cellular), E-TDMA (Enhanced-Time Division Multiple Access), WCDMA (Wideband Code Division Multiple Access), CDMA2000, LTE (Long Term Evolution), or Wibro (Wireless Broadband Internet).

Figure 11:
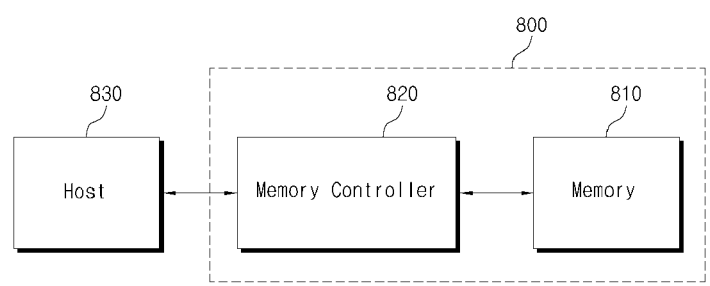
FIG. 11 is a block diagram of a memory card including a semiconductor package in accordance with an embodiment.

Referring to FIG. 11, the semiconductor packages in accordance with the present embodiments may be provided in the form of a memory card 800. For example, the memory card 800 may include a memory 810 such as a nonvolatile memory device and a memory controller 820. The memory 810 and the memory controller 820 may store data or read stored data.

The memory 810 may include one or more nonvolatile memory devices to which the semiconductor packages in accordance with the present embodiments are applied, and the memory controller 820 may control the memory 810 to read data stored therein or to store data therein in response to a write/read request from a host 830.

While various embodiments have been described above, it will be understood by those skilled in the art that the embodiments described are by way of example only. Accordingly, the semiconductor package described herein should not be limited based on the described embodiments.

What is claimed is:

1. A semiconductor package comprising:
   a DRAM chip mounted on a substrate;
   an interposer stacked over the DRAM chip and comprising redistribution structures;
   a nonvolatile memory chip stacked over the interposer;
   a memory controller chip mounted on the substrate, and comprising a control circuit for controlling the nonvolatile memory chip and first pads and second pads electrically coupled to the control circuit;
   first conductive coupling members configured to electrically couple bonding pads of the nonvolatile memory chip to the redistribution structures;
   second conductive coupling members configured to electrically couple the redistribution structures to the first pads; and
   third conductive coupling members configured to electrically couple the second pads to the substrate,
   wherein the memory controller chip is arranged closer to the substrate than the nonvolatile memory chip, and the nonvolatile memory chip is electrically coupled to the substrate through the first conductive coupling members, the redistribution structures, the second conductive coupling members, the memory controller chip, and the third conductive coupling members,
   wherein the substrate comprises:
      first bonding fingers formed on the top surface of the substrate on which the DRAM chip and the memory controller chip are mounted, and electrically coupled to bonding pads of the DRAM chip;
      second bonding fingers formed on the top surface of the substrate, and electrically coupled to the second pads;
      first external electrodes formed on the bottom surface of the substrate, facing the top surface thereof, and electrically coupled to the first bonding fingers;
      second external electrodes formed on the bottom surface of the substrate and electrically coupled to the second bonding fingers;
      first internal lines configured to electrically couple the first bonding fingers to the first external electrodes; and
      second internal lines configured to electrically couple the second bonding fingers to the second external electrodes.

2. The semiconductor package of claim 1, wherein the nonvolatile memory chip comprises a NAND flash chip.

3. The semiconductor package of claim 1, wherein the redistribution structures are arranged on the top surface of the interposer, and
   each of the redistribution structures comprises:
      a first redistribution pad to which the first conductive coupling member is coupled;

a second redistribution pad to which the second conductive coupling member is coupled; and a redistribution line configured to couple the first redistribution pad and the second redistribution pad.

4. The semiconductor package of claim 3, further comprising dielectric layer formed on the top surface of the interposer so as to cover the redistribution lines while leaving the first redistribution pads and the second redistribution pads exposed.

5. The semiconductor package of claim 1, wherein the redistribution structures comprise line-type pads having one end coupled to the first conductive coupling members, respectively, and an other end facing the one end and coupled to the second conductive coupling members, respectively.

6. The semiconductor package of claim 5, further comprising dielectric layer formed on the top surface of the interposer so as to leave the line-type pads exposed.

7. The semiconductor package of claim 1, wherein the first, second and third conductive coupling members comprise conductive wires.

8. The semiconductor package of claim 1, further comprising fourth conductive coupling members configured to electrically couple the bonding pads of the DRAM chip to the first bonding fingers.

9. The semiconductor package of claim 8, wherein the fourth conductive coupling members comprise conductive wires.

10. The semiconductor package of claim 1, wherein the third conductive coupling members comprise bumps.

11. The semiconductor package of claim 10, wherein the bumps are formed on an active surface of the memory controller chip, on which the first pads and the second pads are positioned, and electrically coupled to the second pads, and the memory controller chip is mounted on bonding fingers formed on the top surface of the substrate through the bumps.

12. The semiconductor package of claim 11, wherein the memory controller chip further comprises:

additional pads formed on an inactive surface facing the active surface; and through-chip vias configured to electrically couple the additional pads to the first pads through the memory controller chip.

13. The semiconductor package of claim 1, wherein the interposer comprises an overhang portion protruding beyond a side surface of the DRAM chip, and the memory controller chip is arranged in such a manner that at least a part of the memory controller chip is covered by the overhang portion.

14. The semiconductor package of claim 1, wherein the interposer comprises an overhang portion protruding beyond a side surface of the DRAM chip, and the third conductive coupling members are arranged under the overhang portion.

15. The semiconductor package of claim 1, wherein the substrate excludes internal lines for electrically coupling the nonvolatile memory chip and the memory controller chip.

16. The semiconductor package of claim 1, wherein the redistribution structures are formed over the memory controller chip, where the redistribution structure is in contact with the memory controller chip only via the second conductive coupling member.

17. The semiconductor package of claim 1, wherein the memory controller chip is formed underneath the interposer and the memory controller chip is coupled to the redistribution structures via the second conductive coupling members and coupled to bonding fingers disposed in the substrate via the third conductive coupling members.

18. The semiconductor package of claim 1, wherein the interposer comprises an overhang portion protruding beyond a side surface of the DRAM chip, and the nonvolatile memory chips are stacked above but not over the memory chip controller.

19. The semiconductor package of claim 1, wherein second redistribution pads of the redistribution structures are coupled to the first pads of the memory controller chip through the second conductive coupling members, and the second pads of the memory controller chip are coupled to second bonding fingers disposed in the substrate via the third conductive coupling member.

* * * * *